(12) United States Patent
Liu

(10) Patent No.: US 6,927,448 B2
(45) Date of Patent: Aug. 9, 2005

(54) NAND TYPE DUAL BIT NITRIDE READ ONLY MEMORY

(75) Inventor: Chien-Hung Liu, Hsinchu (TW)

(73) Assignee: Macronix International Co. Ltd., Hsinchu (TW)

(*) Notice: Subject to any disclaimer, the term of this patent is extended or adjusted under 35 U.S.C. 154(b) by 21 days.

(21) Appl. No.: 10/682,861

(22) Filed: Oct. 14, 2003

(65) Prior Publication Data

US 2005/0006694 A1 Jan. 13, 2005

(30) Foreign Application Priority Data

Jul. 11, 2003 (TW) .......................... 92119086 A

(51) Int. Cl.⁷ .......................................... H01L 29/788
(52) U.S. Cl. ...................... 257/315; 257/315; 257/346
(58) Field of Search .................... 257/315, 346, 257/314, 316, 324, 335, 365, 411

(56) References Cited

U.S. PATENT DOCUMENTS 5,384,743 A * 1/1995 Rouy .................... 365/185.12

* cited by examiner

Primary Examiner—David Nelms
Assistant Examiner—Thinh T Nguyen
(74) Attorney, Agent, or Firm—Rabin & Berdo, P.C.

(57) ABSTRACT

A NAND type dual bit nitride read only memory and a method for fabricating thereof are provided. Firstly, a plurality of isolation layers, which are spaced and parallel to each other are formed in the substrate. Next, a plurality of word lines and a plurality of oxide-nitride-oxide (ONO) stack structures are formed on the substrate. The word lines are spaced and parallel to each other, and also the word lines are perpendicular to the isolation layers. Each of the ONO stack structure is located between the corresponding word line and the substrate. And then a plurality of discontinuous bit lines, which are located between the word lines and between the isolation layers are formed on the substrate. The structure of the present invention of the NAND type dual bit nitride read only memory is similar to that of a complementary metal-oxide semiconductor (CMOS), and their fabrication processes are fully compatible.

10 Claims, 12 Drawing Sheets

_US 6,927,448 B2_

NAND TYPE DUAL BIT NITRIDE READ ONLY MEMORY

This application claims the benefit of Taiwan application Serial No. 92119086, filed Jul. 11, 2003.

BACKGROUND OF THE INVENTION

1. Field of the Invention

The invention relates in general to a memory and a method for fabricating the same, and more particularly to a NAND type dual bit nitride read only memory (also called N-bit) and a method for fabricating the same, that a process sequence is fully compatible with a complementary metal-oxide semiconductor (CMOS) process.

2. Description of the Related Art

N-bits (nitride read only memory) can be classified as NOR type N-bit and NAND type N-bit. NOR type N-bit features in capacities of storing instructions, prompt execution, rapid reading, large memory cell area and small storage capacity. NOR type N-bit is mainly applied in mobile phones, optical disk drives, hard disks and printers. NAND type N-bit features in data storage but not instruction storage. Also, the NAND type N-bit has small area and large storage capacity. The main application of the NAND type N-bit is in memory card of electronic products, such as MP3 players, digital cameras, digital video recorders, mobile phones, and the like.

With reference to FIGS. 1A and 1B simultaneously, FIG. 1A is a vertical view of a part of a conventional NOR type dual bit N-bit, while FIG. 1B is a cross-sectional view along hatches of 1B to 1B' of FIG. 1A of a NOR type dual bit N-bit. In FIGS. 1A and 1B, a NOR type dual bit N-bit 30 includes at least a silicon substrate 10, a plurality of buried bit lines 20, a plurality of word lines 24, a plurality of oxide-nitride-oxide (ONO) stack structures 17, a plurality of barrier diffusion oxide 22, a plurality of memory cells 32, which are large dotted-line ranges of FIG. 1A and FIG. 1B, a plurality of first bit storage nodes 34, and a plurality of second bit storage cells 36, which are small dotted-line ranges of FIG. 1A and FIG. 1B.

In FIG. 1A, the buried bit lines 20 are formed in a spaced and parallel manner in the substrate 10, and the word lines 24 are also formed in a spaced and parallel manner above the substrate 10. The word lines 24 are perpendicular to the buried bit lines 20. In FIG. 1B, the ONO stack structures 17 is located between each of the word lines 24 and the substrate 10. Each of the ONO stack structure 17 includes a bottom oxide layer 11, a silicon nitride (SiN) layer 13, and a top oxide layer 15 from the below to the top. In addition, the barrier diffusion oxide 22 are formed above the buried bit lines 20 to isolate the word lines 24.

The memory cells 32 are formed by the word lines 24, the buried bit lines 20, and the ONO stack structures 17. The memory cells 32 form as a cell array as shown in FIG. 1A. Each of the memory cells 32 includes the first bit storage nodes 34 and the second bit storage nodes 36. The first bit storage nodes 34 and the second bit storage nodes 36 of every memory cell 32 are spaced at intervals along an extension direction of the word lines 24, so that the area of every memory cell 32 can be larger.

Referring to FIG. 2A to FIG. 2E, a cross-sectional view of procedures of a fabricating method for a NOR type dual bit N-bit of FIG. 1B is shown. Firstly, the silicon substrate 10 is provided and an ONO layer 16 is formed on the silicon substrate 10. The ONO layer 16 includes the bottom oxide layer 11, the silicon nitride (SiN) layer 13, and the top oxide layer 15 from the below to the top in order. Subsequently, a patterned photoresist layer 18 is formed on the ONO layer 16. And also the spaced and parallel buried bit lines 20 are formed by utilizing an ion implantation process. The buried bit lines 20 are formed in the silicon substrate 10, which is not covered by the patterned photoresist layer 18 as shown in FIG. 2B. Ion implantation is applied to form the buried bit lines 20, which includes the steps of: increasing the energy or kinetic energy of the dopant and implanting the dopant to the silicon substrate 10 through the ONO layer 16.

Next, the exposed part of the top oxide layer 15 and the silicon nitride (SiN) layer 13 thereunder is removed, and also the patterned photoresist layer 18 is removed as shown in FIG. 2C. Sequentially, the barrier diffusion oxide 22 are formed on the buried bit lines 20, and the barrier diffusion oxide 22 partitions the remaining ONO layer 16 into several ONO stack structures 17 as shown in FIG. 2D. And then the spaced word lines 24 perpendicular to the buried bit lines 20 are formed on the ONO stack structures 17, so that the NOR type dual bit N-bit 30 is accomplished, as shown in FIG. 2E. In a step of forming the word lines 24, a polysilicon layer can be formed on the silicon substrate 10 first, and then a part of the polysilicon layer is removed by photolithography and etching, so as to form the word lines 24.

Because the barrier diffusion oxide 22 and the word lines 24 are completed by thermal process, and also the buried bit lines 20 is formed prior to the formation of the barrier diffusion oxide 22 and the word lines 24, the ion dopant of the buried bit lines 20 tends to diffuse during and after the thermal process. Thereby the concentration of the ion dopant of the buried bit lines 20 differs from the original. The electricity quality of the NOR type N-bit 30 is consequently influenced.

SUMMARY OF THE INVENTION

It is therefore an object to provide a NAND type dual bit nitride read only memory (N-bit) and a method for fabricating the same, so as to prevent the diffusion phenomenon caused by an impact of high temperature on the dopant ion of the buried bit lines. Further, a structure of the present invention of the NAND type dual bit nitride read only memory (N-bit) is similar to a structure of a complementary metal-oxide semiconductor (CMOS), and also a process sequence is fully compatible. Therefore, a difficulty in research and development of the fabrication of the N-bit can be reduced, and a design for a cell scaling can have higher potential.

According to an object of the present invention, a NAND type dual bit dual bit nitride read only memory (N-bit) is provided, including at least a substrate, a plurality of isolation layers, a plurality of word lines, a plurality of oxide-nitride-oxide (ONO) stack structures, and a plurality of discontinuous bit lines. The isolation layers are spaced and parallel to each other in the substrate. The word lines are spaced and parallel to each other on the substrate. The word lines are perpendicular to the isolation layers. Each of the oxide-nitride-oxide (ONO) stack structures is formed between the corresponding word line and the substrate. The discontinuous bit lines are formed in the substrate, and the discontinuous bit lines are located between the word lines and between the isolation layers.

According to another object of the present invention, a method for fabricating a NAND type dual bit nitride read only memory (N-bit) is provided. Firstly, a substrate is provided. And then a plurality of isolation layers, which are spaced and parallel to each other in the substrate are formed. Next, a plurality of word lines and a plurality of oxide-nitride-oxide (ONO) stack structures on the substrate are formed. The word lines are spaced and parallel to each other, and also the word lines are perpendicular to the isolation layers. Each of the ONO stack structures is located between the corresponding word lines and the substrate. And then a plurality of discontinuous bit lines are formed in the substrate, wherein the discontinuous bit lines are located between the word lines and between the isolation layers.

According to another object of the present invention, a method for fabricating a NAND type dual bit nitride read only memory (N-bit) is provided. Firstly, a substrate is provided and several spaced and parallel isolation layers are formed in the substrate. And then an ONO layer is formed on the substrate. Next, a polysilicon layer is formed on the ONO layer. Sequentially, a patterned photoresist layer is formed on the polysilicon layer. And then an exposed part of the polysilicon layer and the ONO layer thereunder are removed, so as to form the word lines and the ONO stack structures on the substrate. The word lines are spaced and parallel to each other, and also the word lines are perpendicular to the isolation layers. Each of the ONO stack structures is located under the corresponding word lines. Sequentially, a plurality of discontinuous bit lines are formed in the substrate by utilizing an ion implantation process, wherein the discontinuous bit lines are located between the word lines and between the isolation layers. And then the patterned photoresist layer is removed.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
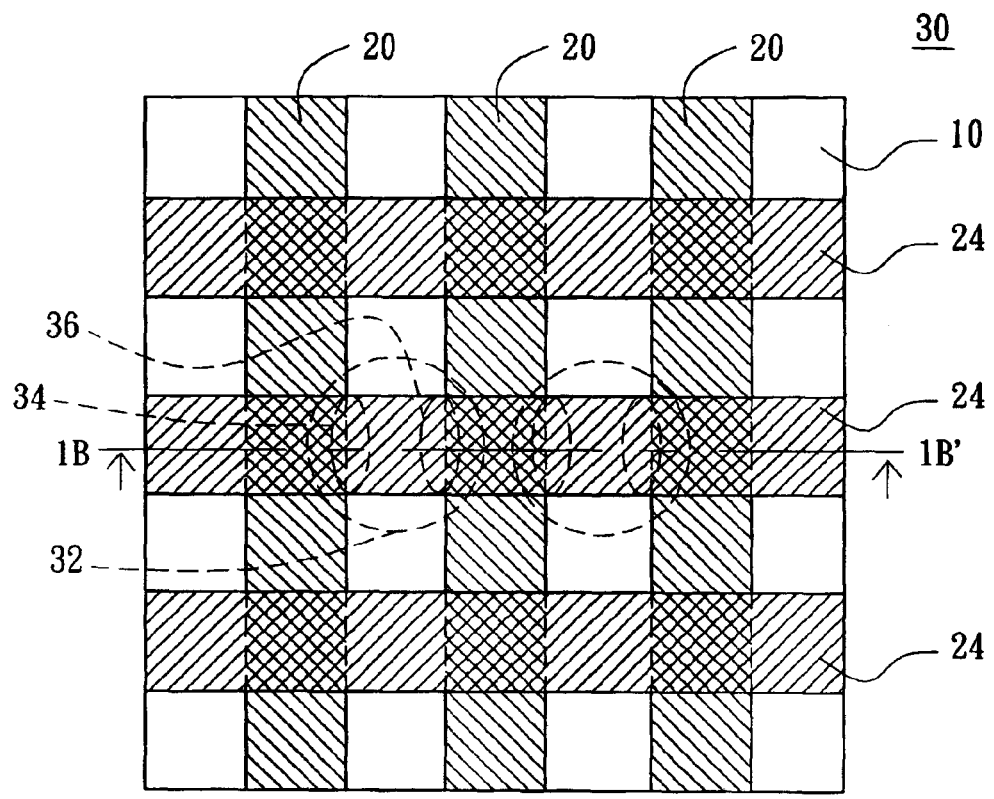
FIG. 1A (prior art) is a vertical view of a part of a conventional NOR type dual bit nitride read only memory.
Figure 1B:
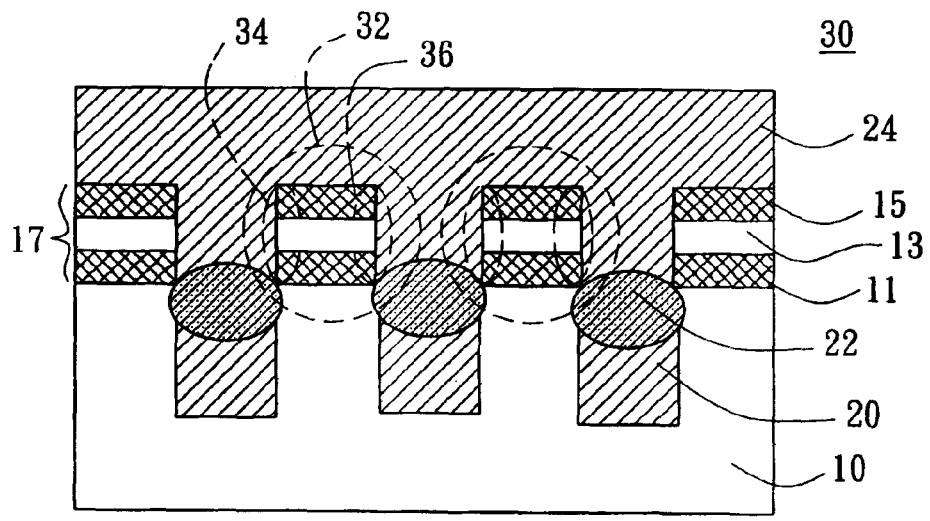
FIG. 1B (prior art) is a cross-sectional view along hatches of 1B to 1B' of FIG. 1A of a NOR type dual bit nitride read only memory.
Figure 2A:
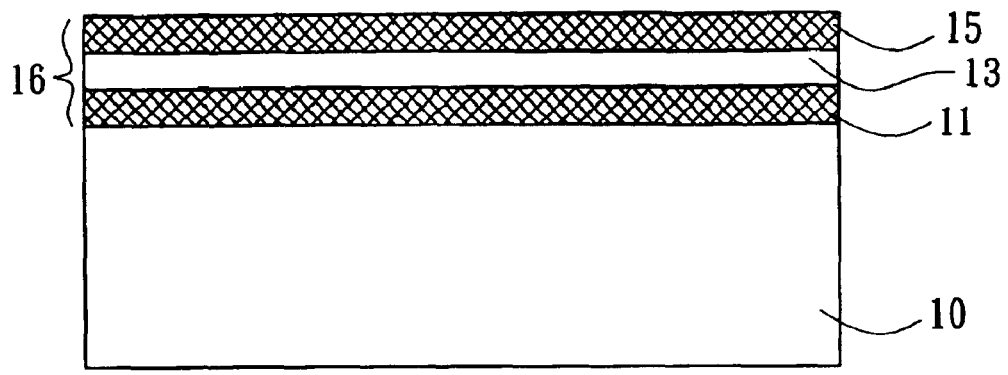
FIG. 2A to 2E illustrate a cross-sectional view of procedures of a fabricating method for a NOR type dual bit nitride read only memory of FIG. 1B.
Figure 2B:
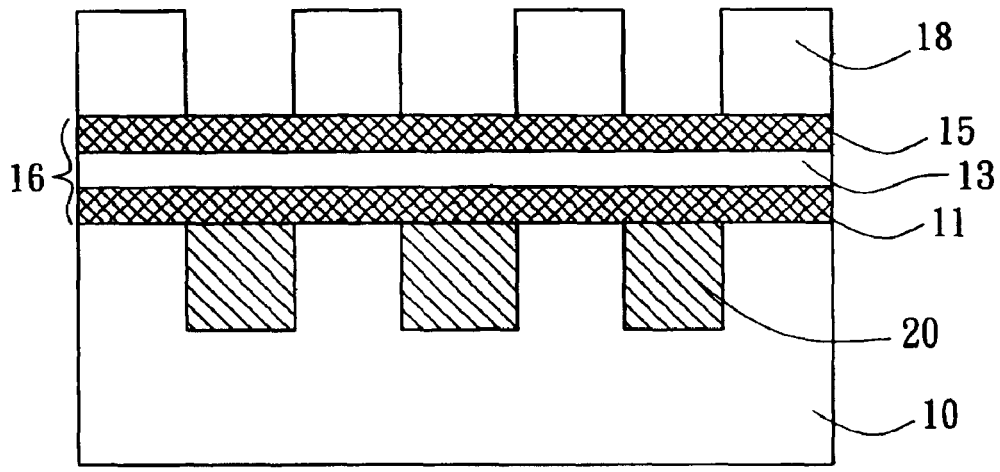
Figure 2C:
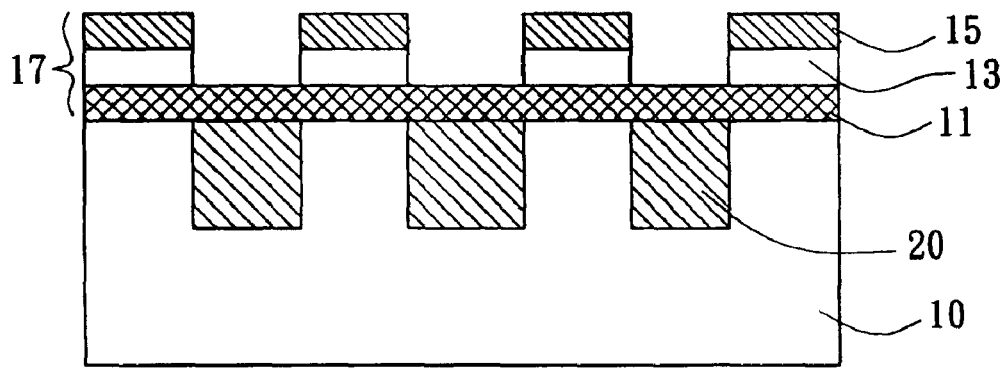
Figure 2D:
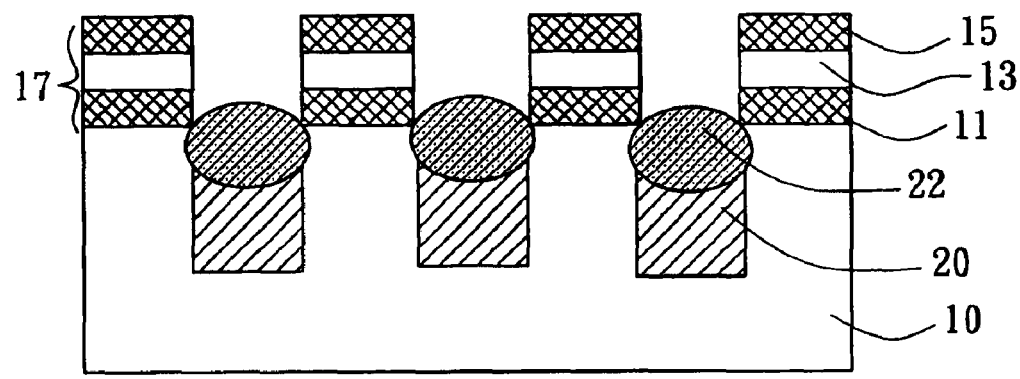
Figure 2E:
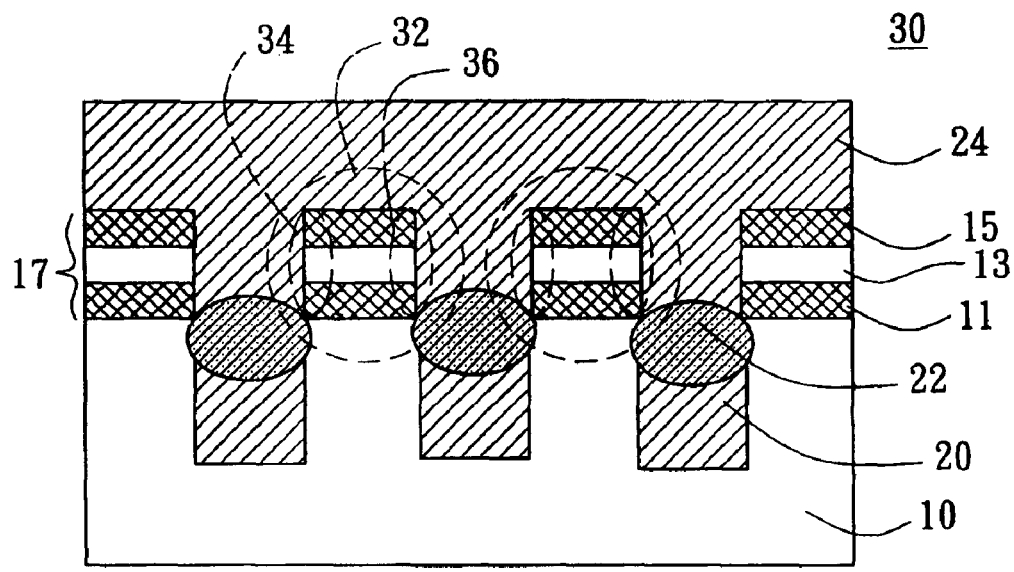
Figure 3A:
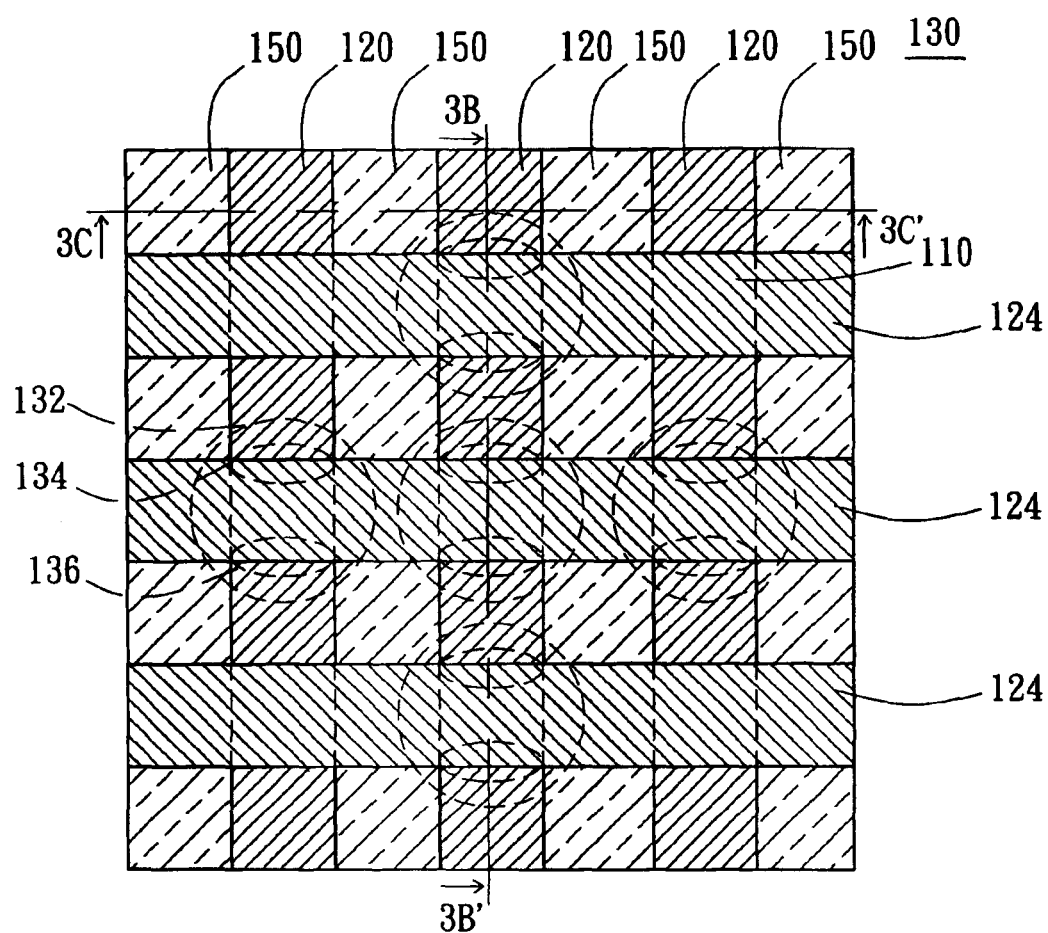
FIG. 3A is a partial vertical view of the present invention of a preferred embodiment of a NAND type dual bit nitride read only memory (N-bit).
Figure 3B:
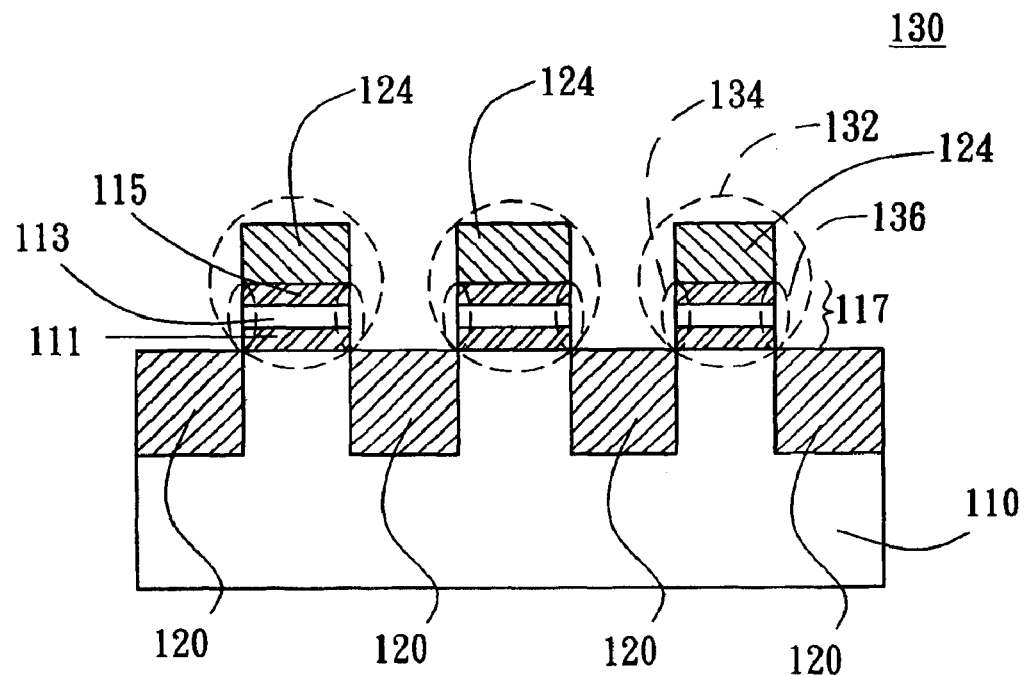
FIG. 3B is a cross-sectional view along hatches of 3B to 3B' of FIG. 3A of a NAND type dual bit nitride read only memory.
Figure 3C:
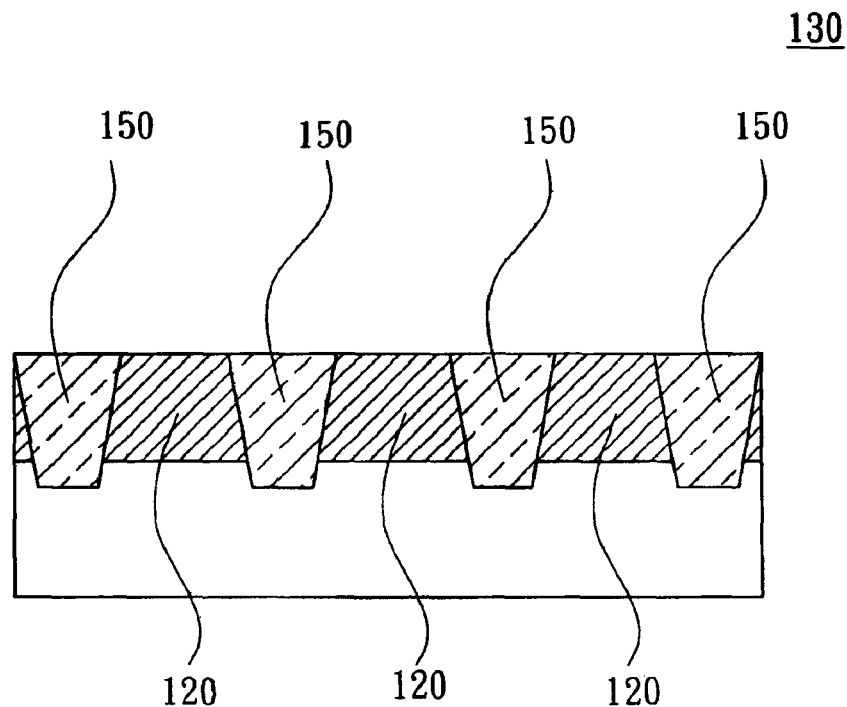
FIG. 3C is a cross-sectional view along hatches of 3C to 3C' of FIG. 3A of a NAND type dual bit nitride read only memory.

The NAND type dual bit nitride read only memory (N-bit) according to the preferred embodiment of the invention is described with reference to FIG. 3A to FIG. 3C. FIG. 3A is a partial vertical view of the present invention of a preferred embodiment of a NAND type dual bit nitride read only memory (N-bit); FIG. 3B is a cross-sectional view along hatches of 3B to 3B' of FIG. 3A of a NAND type dual bit N-bit; and FIG. 3C is a cross-sectional view along hatches of 3C to 3C' of FIG. 3A of a NAND type dual bit N-bit. A NAND type dual bit N-bit 130 includes at least a substrate 110, a plurality of isolation layers 150, a plurality of word lines 124, a plurality of oxide-nitride-oxide (ONO) stack structures 117, a plurality of discontinuous bit lines 120. The memory cells 132 are large dotted-line ranges of FIG. 3A and FIG. 3B. A plurality of first bit storage nodes 134, and a plurality of second bit storage cells 136, which are small dotted-line ranges of FIG. 3A and FIG. 3B.

In FIG. 3A, the isolation layers 150 are spaced and parallel to each other in the substrate 110, and also the word lines 124 are spaced and parallel to each other on the substrate 110. The word lines 124 are perpendicular to the isolation layers 150. In FIG. 3B, each of the ONO stack structures 117 is formed under the corresponding word line 124. The ONO stack structures 117 include a bottom oxide layer 111 formed on the substrate 110, a nitride layer 113 formed on the bottom oxide layer 111, and a top oxide layer 115 formed on the nitride layer 113.

The invention features that the discontinuous bit lines 120 are formed in the substrate, and the discontinuous bit lines are located between the word lines 124 and between the isolation layers 150. The word lines 124, the discontinuous bit lines 120 and the ONO stack structures 117 form the memory cells 132, and the memory cells 132 are arranged as a cell array as shown in FIG. 3A. Every memory cell 132 includes a first storage node 134 and a second storage node 136. The first storage node 134 and the second storage node 136 of every memory cell 132 are arranged at interval along the extension direction of the discontinuous bit lines 120 and also located at two sides of every word line 124, so that the size of every memory cell 132 can be reduced.

Figure 4A:
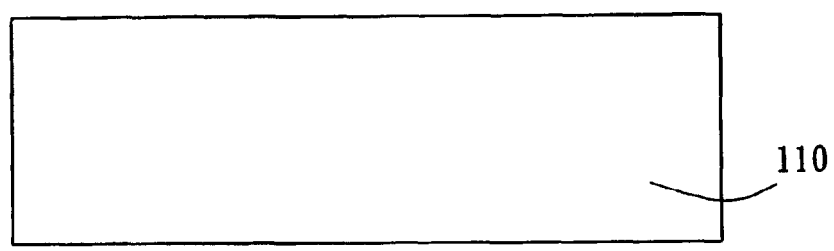
FIG. 4A to FIG. 4D are a cross-sectional view of procedures of a fabricating method for a NAND type dual bit nitride read only memory of FIG. 3B.

With reference to FIG. 4A to FIG. 5D, FIG. 4A to FIG. 4D are a cross-sectional view showing the process of fabricating a NAND type dual bit N-bit of FIG. 3B, FIG. 5A to FIG. 5D are a cross-sectional view showing the process of fabricating a NAND type dual bit N-bit of FIG. 3C, and FIG. 5A to 5D corresponds to FIG. 4A to FIG. 4D, respectively. Firstly, in FIG. 4A and FIG. 5A, a substrate 110 is provided. The substrate 110 can be silicon substrate for example, and also several spaced and parallel isolation layers 150 are formed in the substrate 110. FIG. 4A is a cross-sectional view along a direction of the word line, and it does not show the structure of the insulation layers 150.

Figure 4B:
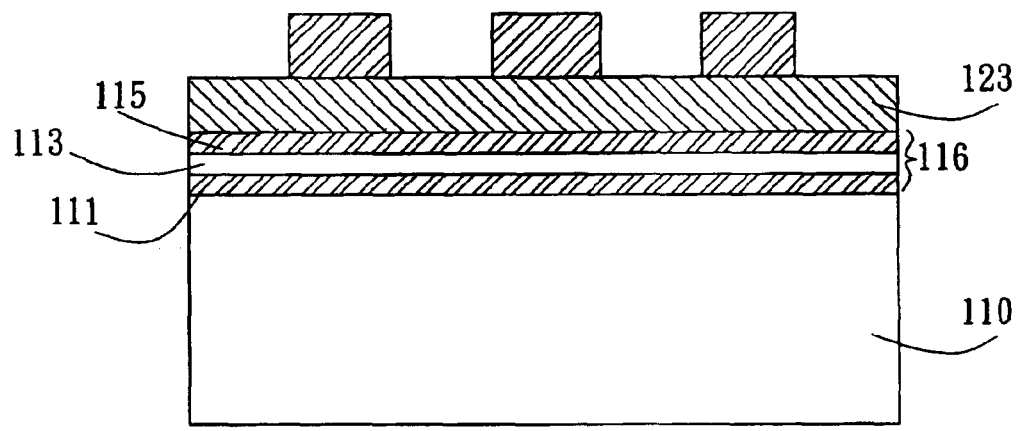
Figure 5A:
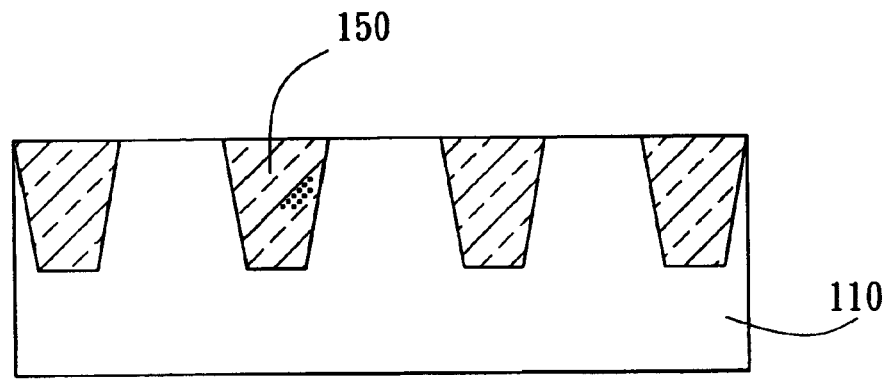
FIG. 5A to FIG. 5D are a cross-sectional view of procedures of a fabricating method for a NAND type dual bit nitride read only memory of FIG. 3C.
Figure 5B:
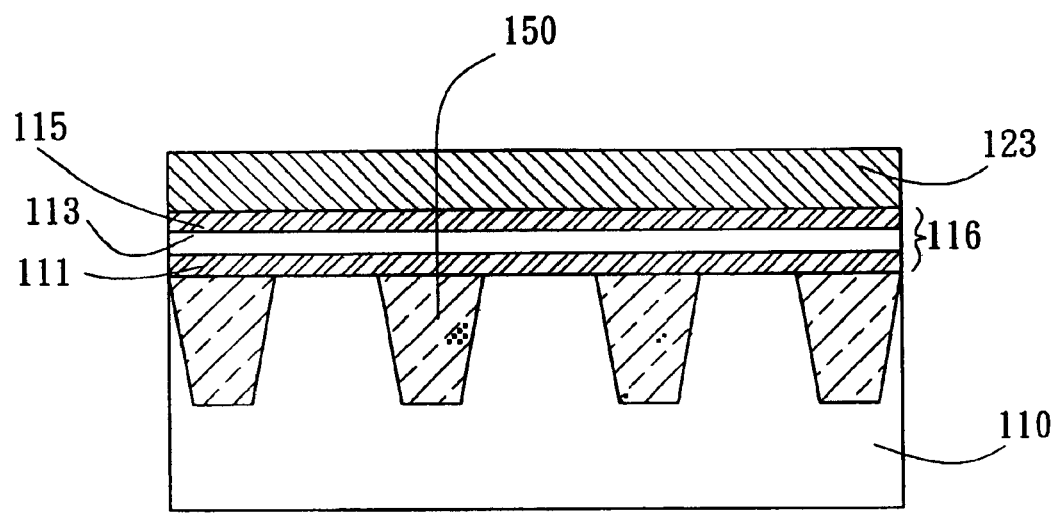

Accordingly, an ONO layer 116, a polysilicon layer 123, and a patterned photoresist layer 118 are formed in order on the substrate 110 as shown in FIG. 4B and FIG. 5B. FIG. 5B is a cross-sectional view along a direction of the word line, and it does not show a structure of the patterned photoresist layer 118. The ONO layer 116 includes a bottom oxide layer 111, a nitride layer 113, and a top oxide layer 115. The nitride layer 113 can be made of silicon nitride, which is formed on the bottom oxide layer 111. And also the top oxide layer 115 is formed on the nitride layer 113. In addition, the polysilicon layer 123 is formed on the ONO layer 116, and the patterned photoresist layer 118 is formed on the polysilicon layer 123.

Figure 4C:
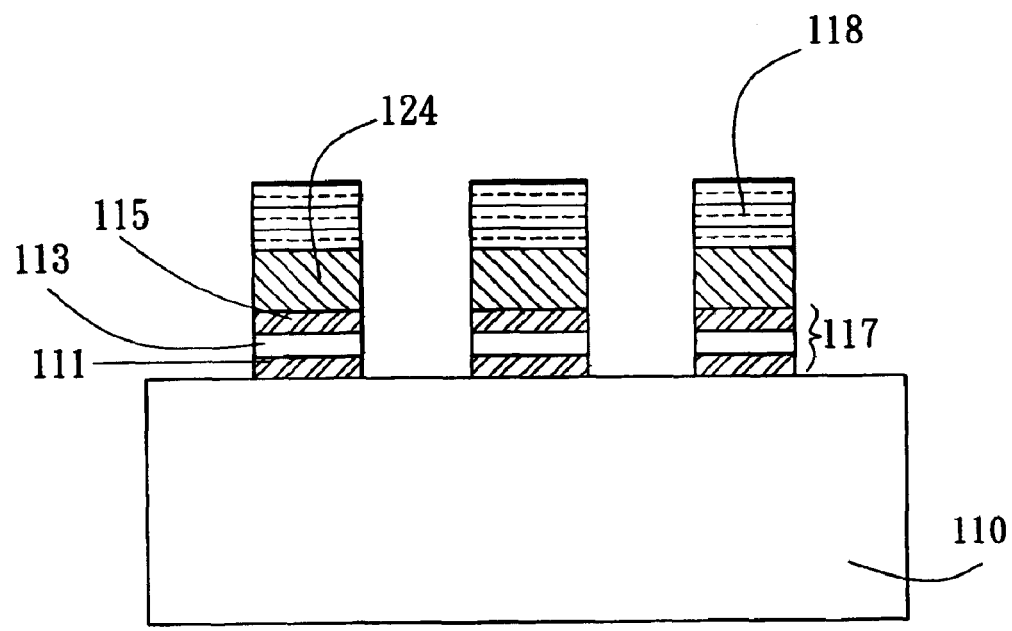
Figure 5C:
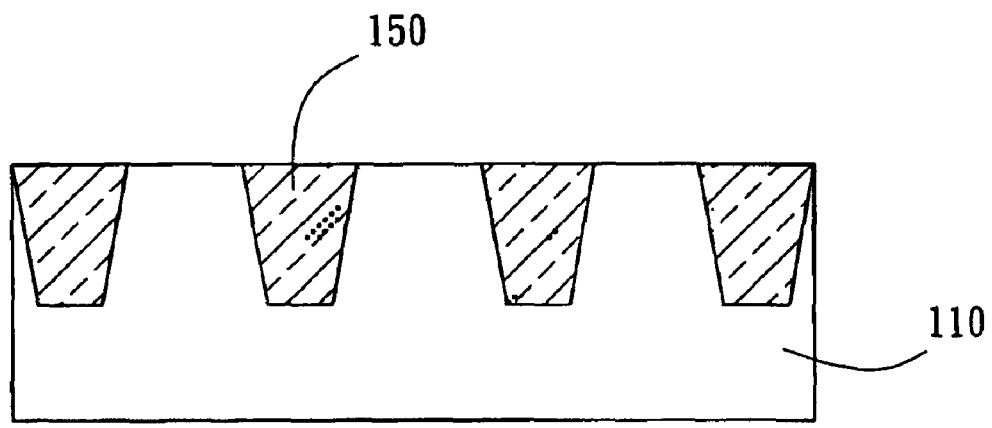

Sequentially, an exposed part of the polysilicon layer 123 and the ONO layer 116 thereunder is removed, so as to form several word lines 124 and several ONO stack structures 117 on the substrate 110. The word lines 124 are spaced and parallel to each other, and also the word lines 124 are perpendicular to the isolation layers 150. Each of the ONO stack structures 117 is located between the corresponding word lines 124 and the substrate 110, as shown in FIGS. 4C and 5C. However, FIG. 5C does not show the word lines 124 and the ONO stack structures 117.

Figure 4D:
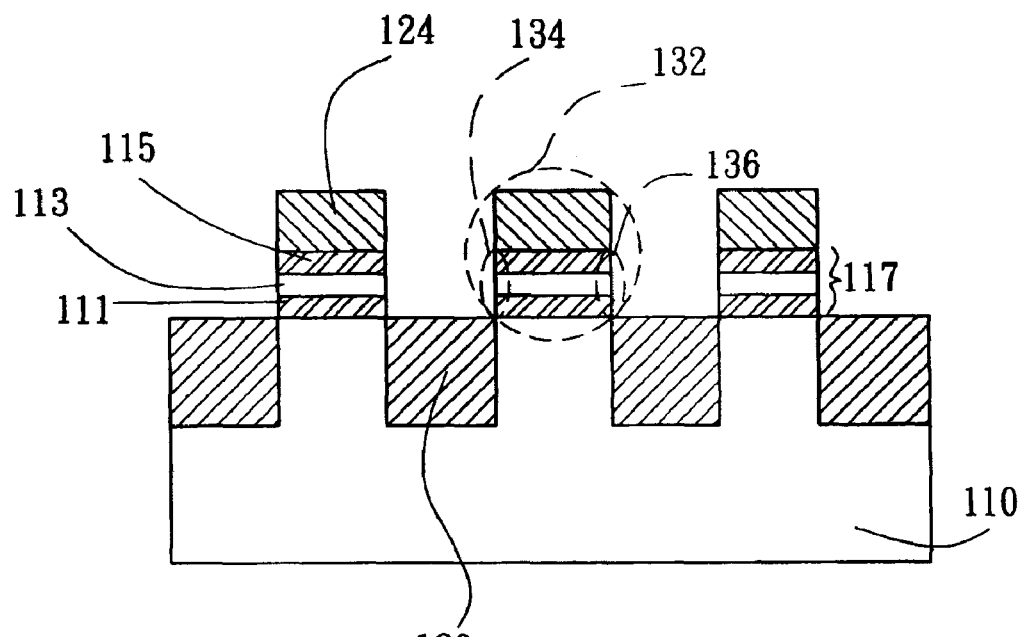
Figure 5D:
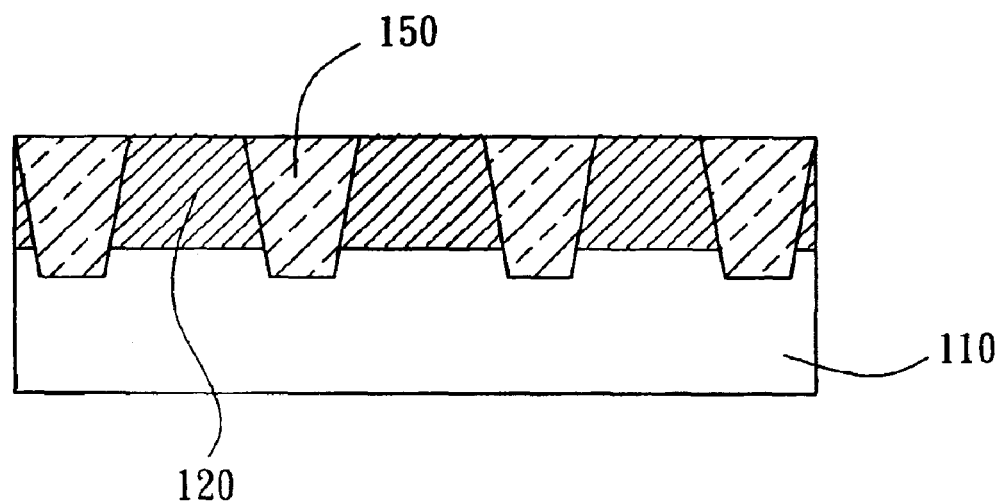

Next, several discontinuous bit lines 120 are formed in the substrate 110, and the discontinuous bit lines 120 are located between the word lines 124 and between the isolation layers 150, and also the patterned photoresist 118 is removed as shown in FIG. 4D and 5D. The discontinuous bit lines 120 are formed by utilizing an ion implantation process between the word lines 124 and between the isolation layers 150 of the substrate 110.

Particularly, the invention can use a shallow trench isolation (STI) process or a local oxidation of silicon (LOCOS) process to form the isolation layers 150 in the substrate 110. A brief description is as follows.

Figure 6A:
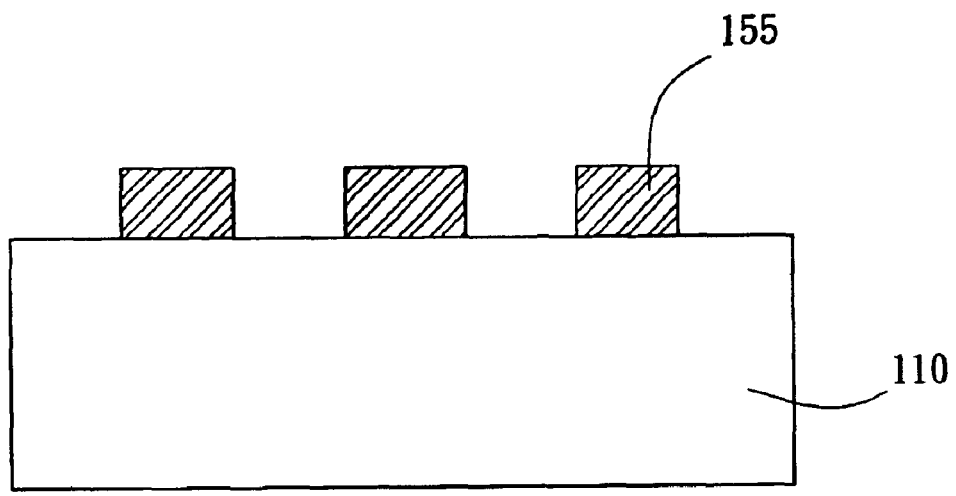
FIG. 6A to FIG. 6C are a cross-sectional view of procedures of a fabricating method of forming the spaced and parallel isolation layers by utilizing a shallow trench isolation (STI) process.
Figure 6B:
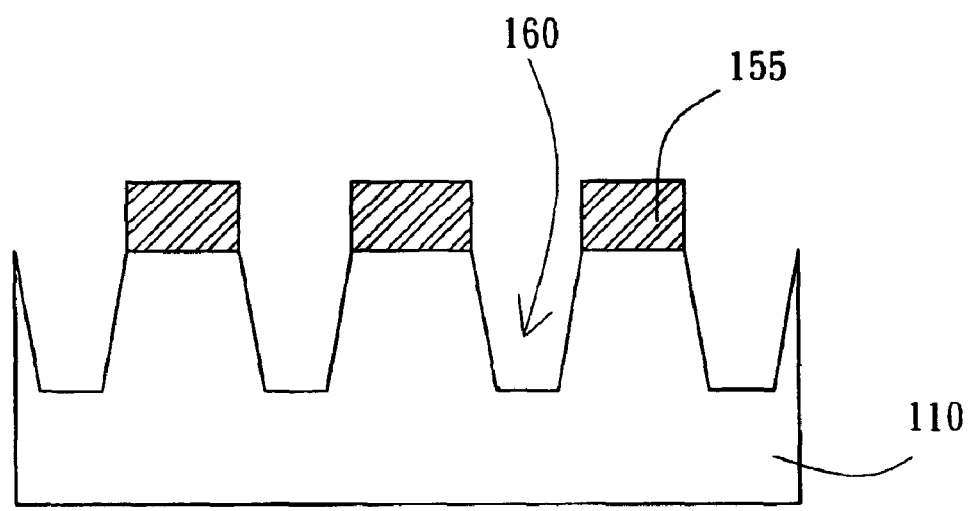
Figure 6C:
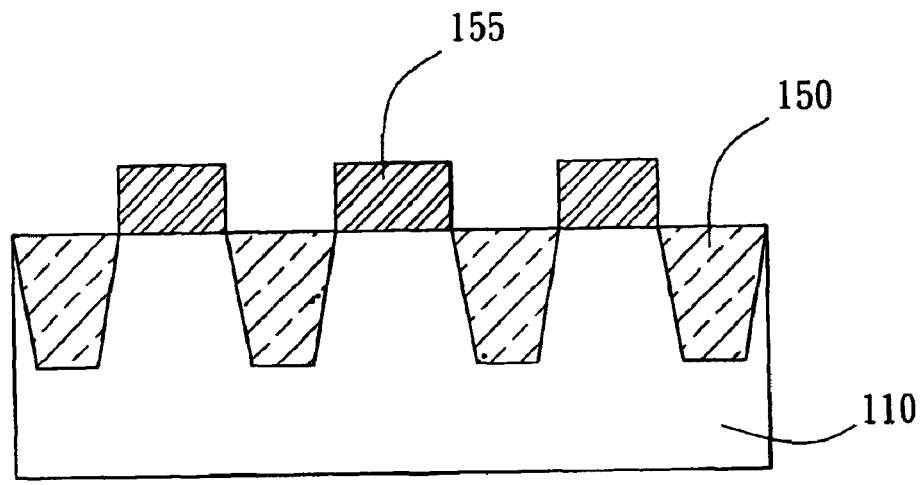

A step of forming the spaced and parallel isolation layers 150 by utilizing a shallow trench isolation (STI) process includes: firstly, a patterned hard mask 155 is formed on the substrate 110, as shown in FIG. 6A. And then an exposed part of the substrate 110 is removed to form a plurality of spaced and parallel shallow trenches 160 in the substrate 110, as shown in FIG. 6B. Next, an insulating material is filled into the shallow trenches 160 to form the spaced and parallel isolation layers 150 in the substrate 110, as shown in FIG. 6C. The insulation is made of silicon dioxide ($SiO_2$), for example. Subsequently, the patterned hard mask 155 is removed, as shown in FIG. 5A.

Figure 7A:
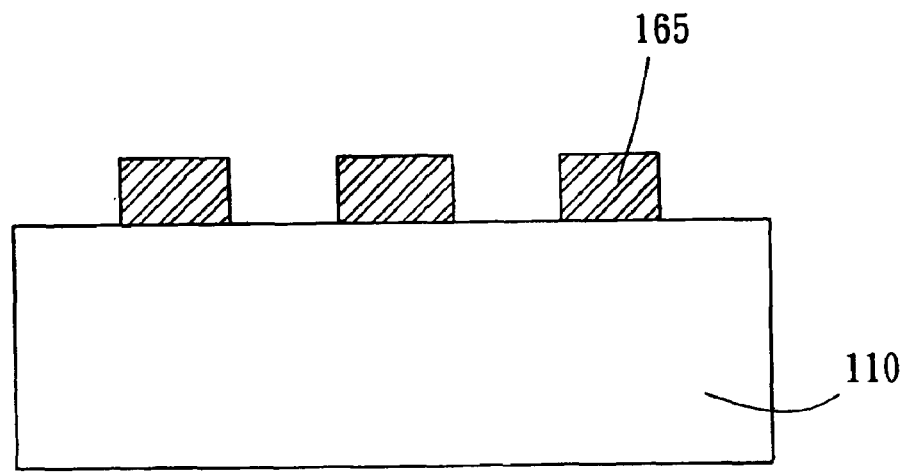
FIG. 7A to FIG. 7B are a cross-sectional view of procedures of a fabricating method of forming the spaced and parallel isolation layers by utilizing a local oxidation of silicon (LOCOS) process.
Figure 7B:
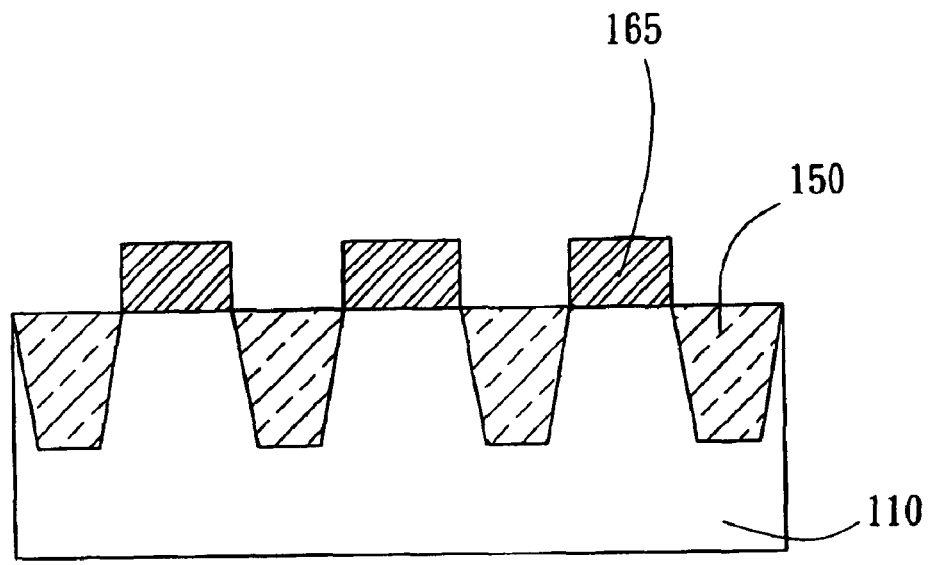

In addition, a step of forming the spaced and parallel isolation layers 150 by utilizing a local oxidation of silicon (LOCOS) process includes: firstly, a patterned hard mask 165 is formed on the substrate 110, as shown in FIG. 7A. The patterned hard mask 165 is made of silicon nitride ($Si_3N_4$). And then an exposed part of the substrate 110 is oxidized to form the spaced and parallel isolation layers 150 in the substrate 110, as shown in FIG. 7B. Next, the patterned hard mask 165 is removed, as shown in FIG. 5A.

Figure 8:
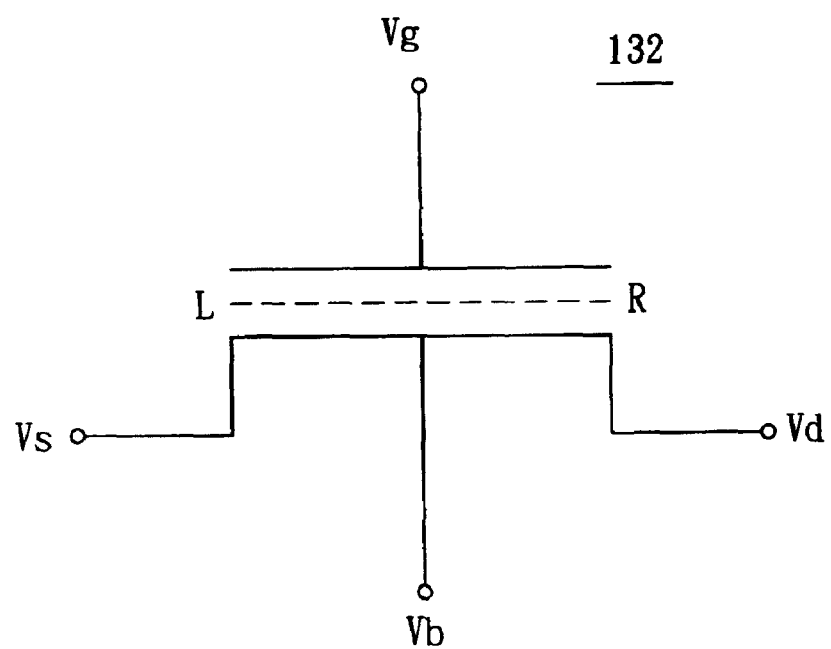
FIG. 8 is a diagram showing a circuit architecture of a memory cell of FIG. 3B.

Referring to FIG. 8, it is a diagram showing a circuit architecture of a cell of FIG. 3B. In FIG. 8, Vg, Vb, Vs, Vd represent applied voltage of the word lines 124 on the memory cell 132, the substrate 110 below the memory cell 132, the word lines 124 left to the memory cell 132, and the word lines 124 right to the memory cell 132, respectively. L represents the first storage node 134, and R represents the second storage node 136. The operation of the memory cell 132 is illustrated by examples as follows.

First, the memory cell 132 is initialized when Vg is set as −5V to −20V and Vd=Vs=Vb=0V;
Second, R is read when Vs=1~3V, Vg=1~3V, and Vd=Vb=0V;
Third, L is read when Vd=1~3V, Vg=1~3V, and Vs=Vb=0V;
Fourth, R is programmed when Vg is set as −2V to −10V, Vd=3~10V, and Vs=Vb=0V;
Fifth, L is programmed when Vg is set as −2V to −10V, Vs=3~10V, and Vd=Vb=0V; and
Sixth, the memory cell 132 is erased when Vg is set as −5V to −20V and Vd=Vs=Vb=0V.

Therefore, the NAND type dual bit nitride read only memory (N-bit) and method for fabricating thereof include the advantages of:

First, the discontinuous bit lines are formed after the thermal process for forming the polysilicon layer and the ONO layer so that the diffusion of the dopant ion in the buried bit lines can be prevented. Therefore, the electricity quality of the NAND type N-bit can be improved.

Second, the invention includes less process steps than the conventional since the formation of the barrier diffusion oxide is omitted. Thus the production cost is reduced.

Third, the structure of the NAND type dual bit nitride read only memory (N-bit) of the present invention is similar to that of the complementary metal-oxide semiconductor (CMOS), and also the processes of the two are fully compatible to each other. Thus, the difficulty of fabricating N-bit can be reduced and the cell scaling becomes more competitive.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A NAND type dual bit nitride read only memory comprising:
   a substrate;
   a plurality of isolation layers in the substrate, wherein the isolation layers are spaced and parallel to each other;
   a plurality of word lines above the substrate, wherein the word lines are spaced and parallel to each other and the word lines are perpendicular to the isolation layers;
   a plurality of oxide-nitride-oxide (ONO) stack structures formed under the corresponding word lines; and
   a plurality of discontinuous bit line between the word lines and between the isolation layers in the substrate.

2. The memory according to claim 1, wherein the substrate is a silicon substrate.

3. The memory according to claim 1, wherein the isolation layers are formed by a shallow trench isolation (STI) process.

4. The memory according to claim 1, wherein the isolation layers are formed by a local oxidation of silicon (LOCOS) process.

5. The memory according to claim 1, wherein each of the isolation layers is made of an insulating material.

6. The memory according to claim 1, wherein each of the isolation layers is made of silicon dioxide ($SiO_2$).

7. The memory according to claim 1, wherein each of the oxide-nitride-oxide (ONO) stack structures comprises:
   a bottom oxide layer on the substrate;
   a nitride layer on the bottom oxide layer; and
   a top oxide layer on the nitride layer.

8. The memory according to claim 7, wherein the nitride layer is made of silicon nitride.

9. The memory according to claim 1, wherein each of the word lines is made of polysilicon.

10. The memory according to claim 1, wherein the discontinuous bit lines are formed between the word lines and between the isolation layers in the substrate by utilizing an ion implantation process.

* * * * *